(12) United States Patent
Kim et al.

(10) Patent No.: US 8,933,451 B2
(45) Date of Patent: *Jan. 13, 2015

(54) ORGANINC LIGHT EMITTING DISPLAY DEVICE AND METHOD OF MANUFACTURING THE SAME

(75) Inventors: Dae-Woo Kim, Yongin (KR); Chun-Gi You, Yongin (KR); Sun Park, Yongin (KR); Jong-Hyun Park, Yongin (KR); Yul-Kyu Lee, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 426 days.

This patent is subject to a terminal disclaimer.

(21) Appl. No.: 13/198,114

(22) Filed: Aug. 4, 2011

(65) Prior Publication Data

US 2012/0104395 A1 May 3, 2012

(30) Foreign Application Priority Data

Oct. 27, 2010 (KR) .................... 10-2010-0105374

(51) Int. Cl.
*H01L 51/56* (2006.01)
*H01L 27/32* (2006.01)

(52) U.S. Cl.
CPC ........ *H01L 27/3276* (2013.01); *H01L 27/3258* (2013.01)
USPC ..................... 257/59; 257/E51.018

(58) Field of Classification Search
USPC ......................................................... 438/99
See application file for complete search history.

(56) References Cited

U.S. PATENT DOCUMENTS

| 7,777,220 | B2 * | 8/2010 | Choi et al. ...................... 257/40 |
| 8,698,189 | B2 * | 4/2014 | Park et al. ...................... 257/99 |
| 2003/0122989 | A1 | 7/2003 | Park et al. |
| 2004/0102127 | A1 | 5/2004 | Park |
| 2007/0292986 | A1 * | 12/2007 | Fujii .............................. 438/99 |
| 2008/0038867 | A1 * | 2/2008 | Shin et al. ...................... 438/99 |
| 2008/0076204 | A1 * | 3/2008 | Yoon et al. ..................... 438/99 |
| 2008/0237582 | A1 * | 10/2008 | Cho et al. ....................... 257/40 |
| 2009/0128015 | A1 | 5/2009 | Kim et al. |
| 2009/0250690 | A1 * | 10/2009 | Shin et al. ...................... 257/40 |
| 2010/0006832 | A1 * | 1/2010 | Oh et al. ........................ 257/40 |

FOREIGN PATENT DOCUMENTS

| KR | 2003-0057141 | 7/2003 |
| KR | 1020040015655 | 2/2004 |
| KR | 10-2004-0044573 | 5/2004 |
| KR | 10-2009-0050767 | 5/2009 |
| KR | 1020100034427 | 4/2010 |

* cited by examiner

*Primary Examiner* — Fernando L Toledo
*Assistant Examiner* — Valerie N Newton
(74) *Attorney, Agent, or Firm* — H.C. Park & Associates, PLC

(57) ABSTRACT

An organic light emitting display device and method of manufacturing the same are provided. The organic light emitting display device includes: a thin film transistor (TFT) comprising an active layer, a gate electrode, a source electrode, and a drain electrode; an organic light emitting device including a pixel electrode electrically connected to the TFT and formed of the same material and on a same layer as the gate electrode, an emission layer, and an opposing electrode; and a pad electrode formed of the same material and on same layer as the gate electrode. The pad electrode has openings formed therein.

13 Claims, 7 Drawing Sheets ural light emitting display device and method of manufacturing the same.

ORGANINC LIGHT EMITTING DISPLAY DEVICE AND METHOD OF MANUFACTURING THE SAME

CROSS-REFERENCE TO RELATED PATENT APPLICATION

This application claims priority from and the benefit of Korean Patent Application No. 10-2010-0105374, filed on Oct. 27, 2010, the disclosure of which is incorporated herein in its entirety by reference.

BACKGROUND OF THE INVENTION

1. Field

Various embodiments of the present invention relate to an organic light emitting display device and method of manufacturing the same.

2. Description of the Related Art

Flat-panel display devices, such as organic light emitting display devices and liquid crystal display devices, are manufactured on a substrate, on which a thin film transistor (TFT), a capacitor, and wiring are formed. In general, in order to form a fine-structure pattern including a TFT on the substrate, the pattern is transcribed on an array substrate, using a mask having the fine pattern.

The transcribing of the pattern using the mask generally includes the use of photo-lithography. During the photo-lithography, a photoresist is uniformly coated on a substrate, the photoresist is exposed using an exposing device such as a stepper (when the photoresist is a positive photoresist), and the photosensitive photoresist is developed to remove unnecessary portions thereof. After the photoresist is developed, the pattern is etched, using the remaining photoresist as a mask.

A mask including a required pattern is generally prepared prior to transcribing the pattern. Thus, the number of processes performed increases, thereby increasing manufacturing costs.

SUMMARY OF THE INVENTION

Exemplary embodiments of the present invention provide an organic light emitting display device and a method of manufacturing the same. The display device has improved adhesion between a pad electrode and an insulation layer, and thereby, preventing defects during manufacturing According to various embodiments of the present invention, provided is an organic light emitting display device including: a thin film transistor (TFT) including an active layer, a gate electrode, a source electrode, and a drain electrode; and an organic light emitting device. The light emitting device includes a pixel electrode that is electrically connected to the TFT, which is formed of the same material and on the same layer as the gate electrode, an intermediate layer including an emission layer, and an opposing electrode, which are sequentially stacked. A pad electrode formed of the same material and on the same layer as the gate electrode is formed on the light emitting device and includes openings formed in at least one surface thereof.

According to another exemplary embodiment of the present invention, provided is an organic light emitting display device including: a first insulation layer formed on a substrate; an active layer of a thin film transistor (TFT) formed on the first insulation layer; a second insulation layer formed to cover the active layer; a pixel electrode formed on the second insulation layer; a lower gate electrode formed on the active layer; a lower pad electrode formed of the same material and on the same layer as the lower gate electrode; an upper gate electrode formed on the lower gate electrode; and a upper pad electrode formed on the lower pad electrode; a third insulation layer formed to cover the pixel electrode, the upper gate electrode, and at least part of the upper pad electrode; and source and drain electrodes contacting the pixel electrode and formed on the third insulation layer. The lower gate electrode is formed of the same material and on the same layer as the pixel electrode, while being space apart from the pixel electrode. The upper pad electrode and the lower pad electrode can each include a plurality of electrodes that are spaced apart from each other by a predetermined interval.

According to another aspect of the present invention, there is provided a method of preparing an organic light emitting display device, the method including: using a first mask to form a thin film transistor (TFT) active layer on a substrate; using a second mask to form a gate electrode, a pixel electrode, and a pad electrode having a plurality of openings, on the active layer; using a third mask to form an interlayer insulation layer having openings that expose both sides of the active layer and a part of the electrode pattern; using a fourth mask to form source and drain electrodes connected to both exposed sides of the active layer and the pixel electrode; and using a fifth mask to form a pixel define layer (PDL) having an aperture that exposes at least part of the pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
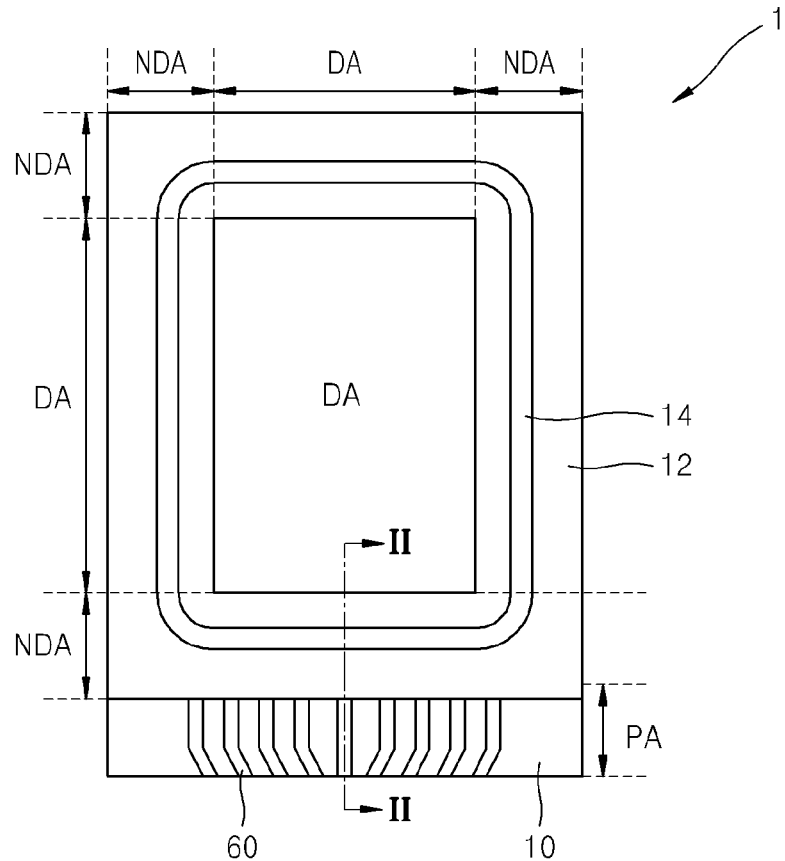
FIG. 1 is a plan view schematically illustrating an organic light emitting display device, according to an exemplary embodiment of the present invention'

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" or "connected to" another element, it can be directly on or directly connected to the other element, or intervening elements may also be present. In contrast, when an element is referred to as being "directly on" or "directly connected to" another element, there are no intervening elements present.

FIG. 1 is a plan view schematically illustrating an organic light emitting display device 1, according to an exemplary embodiment of the present invention. The organic light emitting display device 1 includes a first substrate 10, a thin film transistor (TFT), light emitting pixels, and a second substrate 12 sealed to the first substrate 10.

The TFT, an organic light emitting device (OLED), and a storage capacitor Cst may be formed on the first substrate 10. The first substrate 10 may be a low-temperature polycrystalline silicon (LTPS) substrate, a glass substrate, a plastic substrate, or a steel use stainless (SUS) substrate.

The second substrate 12 may be a sealing substrate disposed on the first substrate 10, so as to prevent external moisture and/or air from infiltrating the TFT and light emitting pixels included on the first substrate 10. The second substrate 12 is disposed to face the first substrate 10 and is adhered to the first substrate 10 by a sealing member 14 disposed along the edges of the first substrate 10 and the second substrate 12. The second substrate 12 may be a transparent glass or plastic substrate.

The first substrate 10 includes a display area DA from which light is emitted and a non-display area NDA disposed outside of the display area DA. According to various embodiments of the present invention, the sealing member 14 is disposed on the non-display area NDA, so as to adhere the first substrate 10 to the second substrate 12.

As described above, the organic light emitting device, the TFT for driving the organic light emitting device, and wirings electrically connected to the organic light emitting device and the TFT, are formed in the display area DA of the first substrate 10. Also, a pad area PA, on which pad electrodes 60 extended from the wirings of the display area DA are disposed, may be included in the non-display area NDA. The pad area PA includes the pad electrodes 60, which are patterned in a predetermined form.

Figure 2:
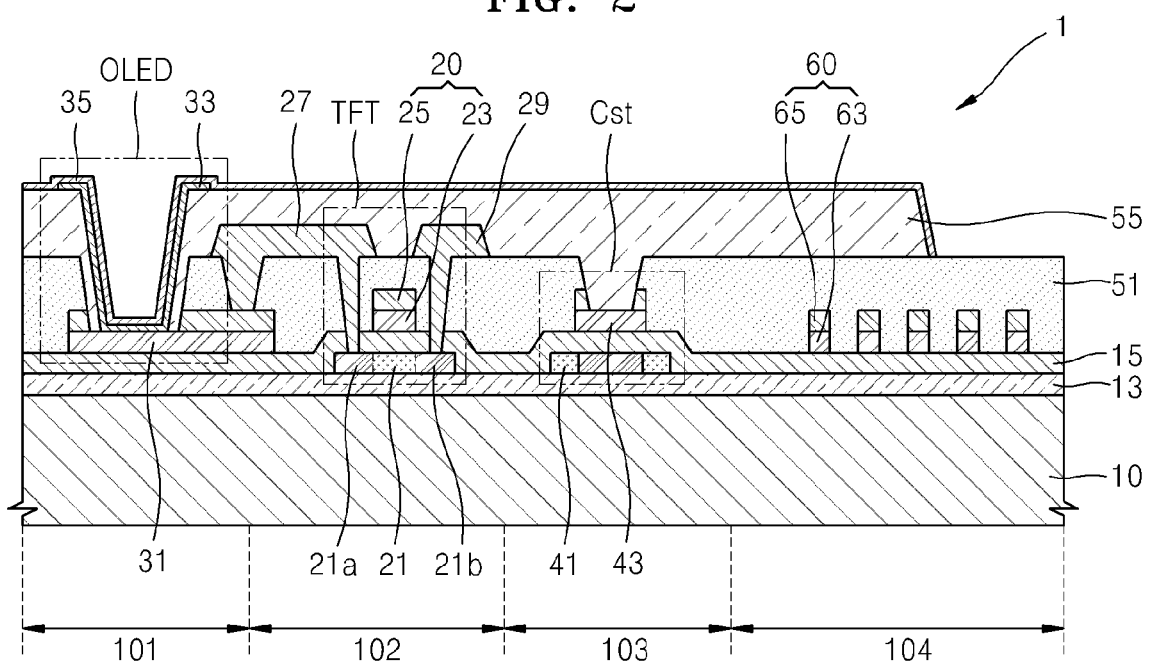
FIG. 2 is a cross-sectional diagram of the organic light emitting display device of FIG. 1 cut along line II-II of FIG. 1.

FIG. 2 is a cross-sectional diagram of the organic light emitting display device 1 of FIG. 1 cut along line II-II of FIG. 1. Referring to FIG. 2, the organic light emitting display device 1 includes a display area 101, a channel area 102, a storage area 103, and a pad area 104.

The channel area 102 includes a TFT as a driving element. The TFT includes an active layer 21, a gate electrode 20, a source electrode 27, and a drain electrode 29. The gate electrode 20 includes a lower gate electrode 23 and an upper gate electrode 25. The lower gate electrode 23 is formed of a transparent conductive material. A gate insulation layer 15 is interposed between the gate electrode 20 and the active layer 21, to insulate the gate electrode 20 from the active layer 21. Also, source and drain areas 21a and 21b, into which a high-concentration of impurities is injected, are formed at opposing edges of the active layer 21 and are connected to the source and drain electrodes 27 and 29, respectively. Although it is described here that element 27 is the source electrode and element 29 is the drain electrode, as an ordinarily skilled artisan understand, alternatively, element 27 may be the drain electrode and element 29 may be the source electrode.

The display area 101 includes the organic light emitting device (OLED). The organic light emitting device OLED includes a pixel electrode 31 connected to one of the source and drain electrodes 27 and 29 of the TFT, an opposing (common) electrode 35, and an intermediate layer 33 interposed between the pixel electrode 31 and the opposing electrode 35. The pixel electrode 31 is formed of a transparent conductive material. The pixel electrode 31 and the gate electrode 20 may be formed using a single process.

The storage area 103 includes a storage capacitor Cst. The storage capacitor Cst includes a lower capacitor electrode 41 and an upper capacitor electrode 43. The gate insulation layer 15 is interposed between the lower capacitor electrode 41 and the upper capacitor electrode 43. The upper capacitor electrode 43, the gate electrode 20, and the pixel electrode 31 can be formed using a single process.

The pad area 104 includes the pad electrodes 60. The pad electrodes 60 each include a lower pad electrode 63 and an upper pad electrode 65 disposed thereon. The lower pad electrode 63 may be formed on the same layer as the pixel electrode 31, the lower gate electrode 23, and the upper capacitor electrode 43, and may be formed of the same type of material. Also, the upper pad electrode 65 may be formed on the same layer as the upper gate electrode 25 and may be formed of the same type of material.

In a conventional organic light emitting display device, a pixel defining layer (PDL) (refer to reference numeral 55 of FIG. 2) is formed of an organic material layer and then a spacer (not illustrated) formed of an organic material layer is formed on the PDL. However, when the PDL and the spacer are separately formed, two photolithography processes are needed. Thus, manufacturing costs and time increase. In this regard, a thicker organic layer, referred to as a thick PDL, may be formed to operate as both the PDL and the spacer. Accordingly, in order to form a thick organic layer to a thickness of at least about 3 um, various attempts have been made to vary the characteristics of organic materials used to form such an organic layer.

Also, in response to increased demand for larger display devices, attempts have been made to increase size of organic light emitting display devices. As the size of an organic light emitting display device increases, the size of a pad electrode disposed inside the organic light emitting display device may also be increased.

However, when a thick organic layer (thickness of at least about 3 um) is used in conjunction with a larger pad electrode, stress may be generated at the interface of the pad electrode and the organic layer. As a result, the organic layer may not be properly coated on the pad electrode, thereby generating panel defects.

In this regard, the organic light emitting display device 1 includes various openings formed in the pad electrode 60, so as to increase the contact area between the pad electrode 60 and an organic layer. Thus, the organic layer may be properly coated on the pad electrode 60. Protrusions may be formed on the surface of the pad electrode 60, so as to minimize the resistance generated between the organic layer and the pad electrode 60. Also, a capillary phenomenon can be used to diffuse the organic layer amongst the protrusions, so as to maximize adhesion between the organic layer and the pad electrode 60.

Figure 3A:
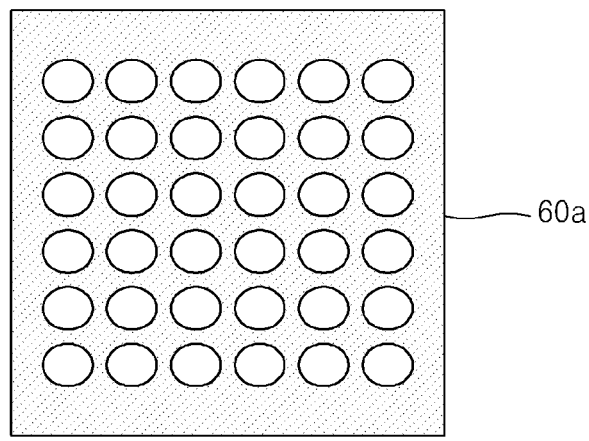
FIGS. 3A, 3B, 3C, and 3D are plan views illustrating various forms of pad electrodes of the organic light emitting display device of FIG. 1.
Figure 3B:
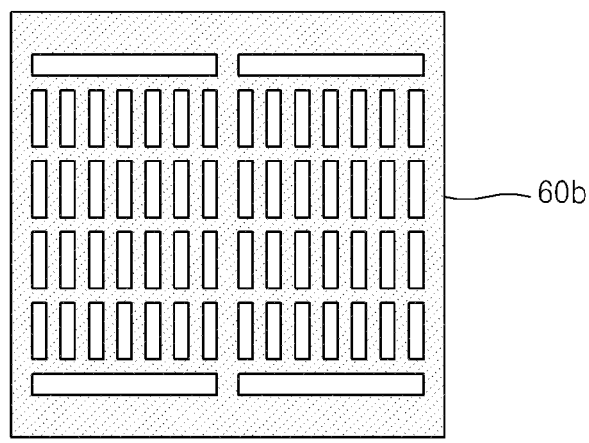
Figure 3C:
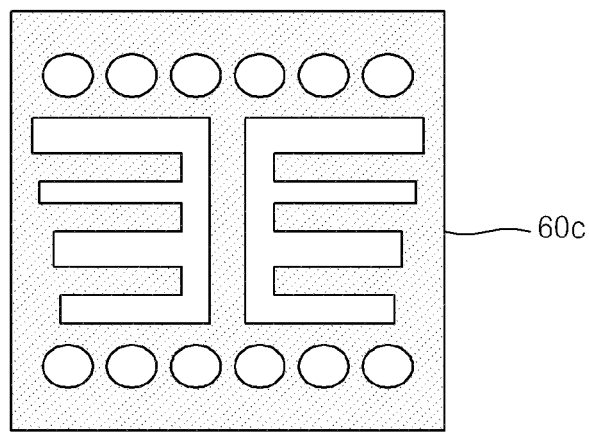
Figure 3D:
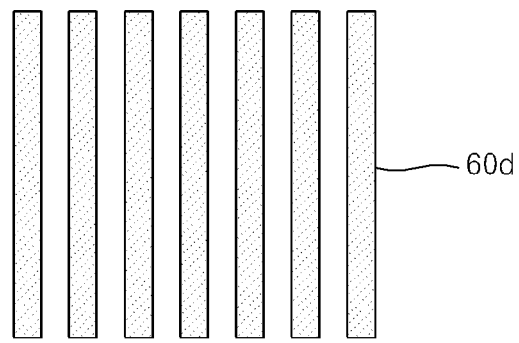

FIGS. 3A through 3D are plan views illustrating various pad electrodes 60A, 60B, 60C, and 60D of the organic light emitting display device 1 of FIG. 1. As illustrated in FIG. 3A, circular or ovoid openings may be uniformly formed on the pad electrode 60A. As illustrated in FIG. 3B, rectangular openings having various sizes may be uniformly formed in the pad electrode 60b. As illustrated in FIG. 3C, circular or ovoid openings and rectangular openings, having various sizes, may be formed in the pad electrode 60C. As illustrated in FIG. 3D, the pad electrode 60D may include a plurality of electrodes that are spaced apart from each other at a predetermined interval.

Figure 4:
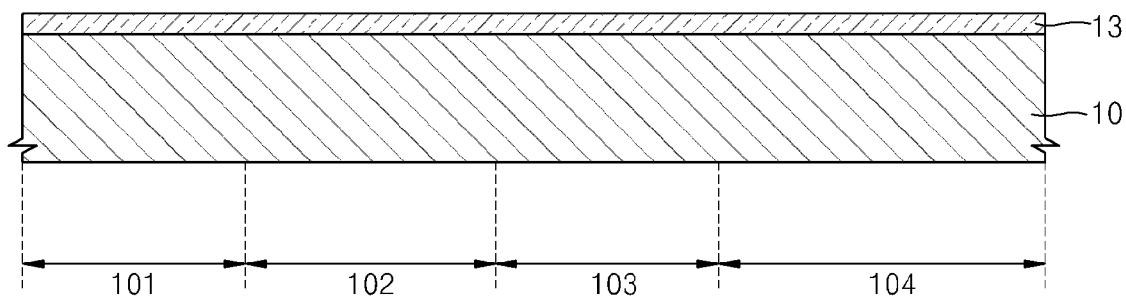
FIGS. 4, 5, 6, 7, 8, 9, 10, 11, 12, and 13 are cross-sectional diagrams illustrating a method of manufacturing the organic light emitting display device of FIG. 1.

FIGS. 4 through 13 are cross-sectional diagrams illustrating a method of manufacturing the organic light emitting display device 1 of FIG. 1. As illustrated in FIG. 4, a first insulation layer 13 is formed on the substrate 10. More specifically, the substrate 10 may be formed of a transparent glass having $SiO_2$ as a main component. However, the substrate 10 is not limited thereto and may be formed of various other materials, such as a transparent plastic or a metal.

The first insulation layer 13 operates as a barrier layer and/or buffer layer, so as to prevent the diffusion of impurity ions and to block the permeation of external moisture and air. The first insulation layer 13 also operates to planarize the surface of the substrate 10. The first insulation layer 13 may include $SiO_2$ and/or $SiN_x$, and may be deposited by using various deposition methods, such as plasma enhanced chemical vapor deposition (PECVD), atmospheric pressure chemical vapor deposition (APCVD), low pressure chemical vapor deposition (LPCVD), or the like.

Figure 5:
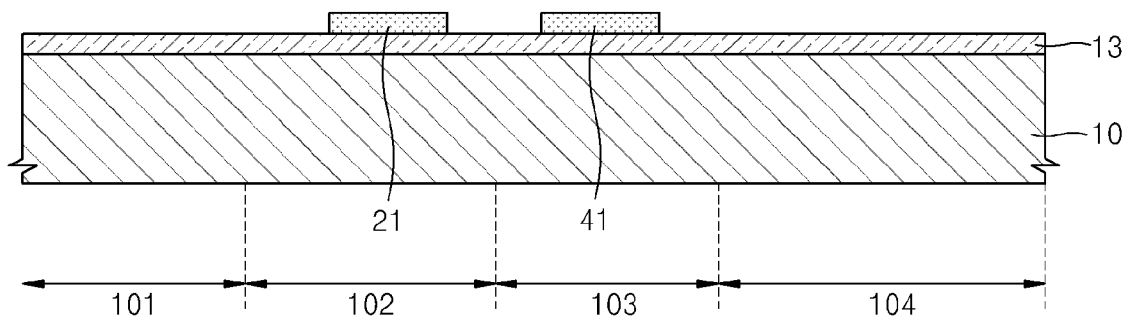

Then, as illustrated in FIG. 5, the active layer 21 of the TFT and the lower capacitor electrode 41 of the storage capacitor Cst are formed on the first insulation layer 13. More specifically, amorphous silicon is deposited on the first insulation layer 13 and is then crystallized, so as to form a polycrystalline silicon layer (not illustrated). The amorphous silicon may be crystallized using various methods, such rapid thermal annealing (RTA), solid-phase crystallization (SPC), excimer laser annealing (ELA), metal-induced crystallization (MIC), metal-induced lateral crystallization (MILC), sequential lateral solidification (SLS), or the like. The polycrystalline silicon layer may be patterned to form the active layer 21 of the TFT and the lower capacitor electrode 41 of the storage capacitor Cst, using a first mask (not illustrated).

In the current exemplary embodiment of the present invention, the active layer 21 and the lower capacitor electrode 41 are formed separately. However, the active layer 21 and the lower capacitor electrode 41 may be integrally formed, as a single body.

Figure 6:
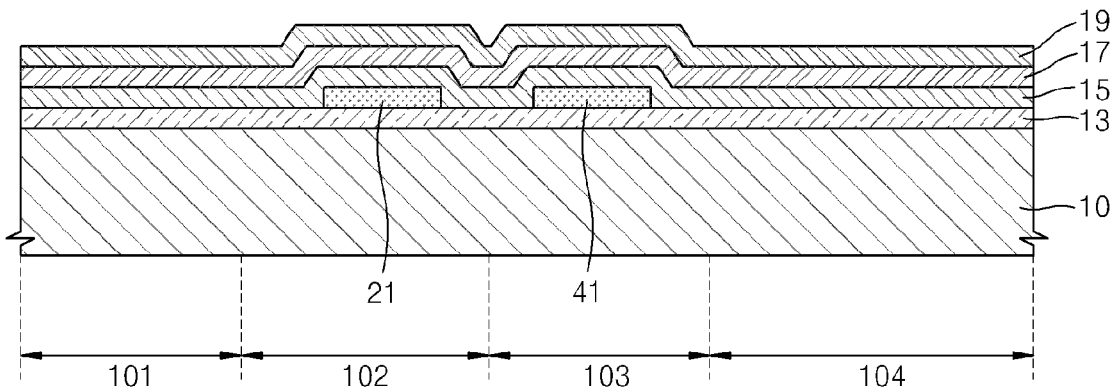

Next, as illustrated in FIG. 6, a second insulation layer 15, a first conductive layer 17, and a second conductive layer 19 are sequentially deposited on the substrate 10, on which the active layer 21 and the lower capacitor electrode 41 are formed. The second insulation layer 15 may be formed by depositing an inorganic insulation layer, such as $SiN_x$ or $SiO_x$, using PECVD, APCVD, or LPCVD. The second insulation layer 15 is interposed between the active layer 21 and the gate electrode 20 and operates as a gate insulation layer of the TFT. Also, the second insulation layer 15 is interposed between the upper capacitor electrode 43 and the lower capacitor electrode 41 and operates as a dielectric layer of the storage capacitor Cst.

The first conductive layer 17 may include at least one transparent material, such as ITO, IZO, ZnO, and $In_2O_3$. The first conductive layer 17 is patterned to form the pixel electrode 31, the lower gate electrode 23, the upper capacitor electrode 43, and the lower pad electrode 63.

The second conductive layer 19 may include at least one material selected from the group consisting of Ag, Mg, Al, Pt, Pd, Au, Ni, Nd, Ir, Cr, Li, Ca, Mo, Ti, W, MoW, and Al/Cu. The second conductive layer 19 is patterned to form the upper gate electrode 25 and the upper pad electrode 65.

Figure 7:
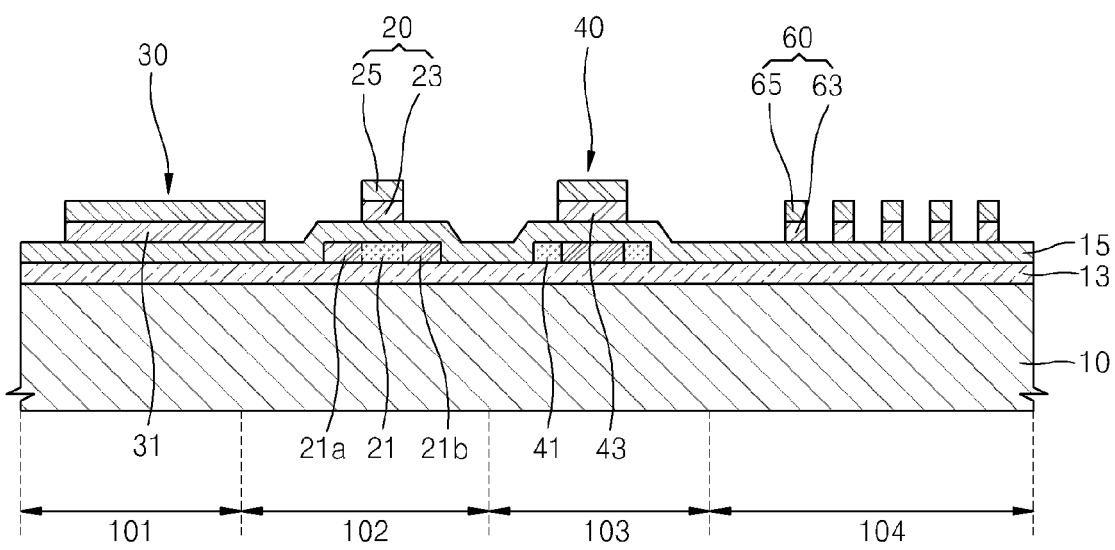

Next, as illustrated in FIG. 7, the gate electrode 20, the pad electrodes 60, and electrode patterns 30 and 40 are formed on the substrate 10. More specifically, the first conductive layer 17 and the second conductive layer 19 are sequentially formed on the substrate 10 and are then patterned using a second mask (not illustrated).

Here, the gate electrode 20 is formed on the active layer 21 in the channel area 102 and includes the lower gate electrode 23, which is a part of the first conductive layer 17, and the upper gate electrode 25, which is a part of the second conductive layer 19. The gate electrode 20 is generally positioned at the center of the active layer 21. An n-type or p-type impurity is doped into the active layer 21 using the gate electrode 20 as a mask, so as to form the source and drain areas 21a and 21b at edges of the active layer 21 (corresponding to both sides of the gate electrode 20), and a channel area interposed between the source and drain areas 21a and 21b.

The electrode pattern 30 is formed in the display area 101, so as to form pixel electrodes. In the storage area 103, the electrode pattern 40 is formed on the lower capacitor electrode 41, so as to form the upper capacitor electrode 43. Also, in the pad area 104, the pad electrodes 60 are formed on the second insulation layer 15. The pad electrodes 60 each include the lower pad electrode 63, which is formed from part of the first conductive layer 17, and the upper pad electrode 65, which is formed from part of the second conductive layer 19. In the organic light emitting display device 1, the pad electrodes 60 are patterned to have openings, as described above with reference to FIGS. 2 and 3.

Figure 8:
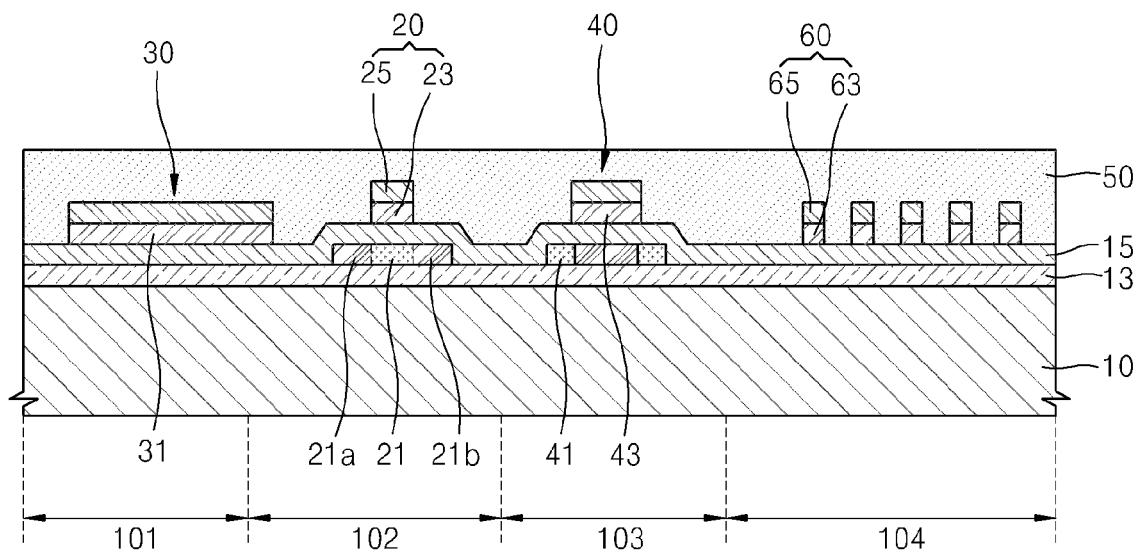

As illustrated in FIG. 8, a third insulation layer 50 is deposited on the substrate 10, on which the gate electrode 20 is formed. The third insulation layer 50 may include at least one organic insulation material, such as, a polyimide, a polyamide, an acryl resin, benzocyclobutene, and a phenol resin. The third insulation layer 50 may be formed using spin coating. The third insulation layer 50 may be thicker than the second insulation layer 15.

The third insulation layer 50 may alternatively include an organic insulation material and an inorganic insulation material used in the second insulation layer 15. In addition, the third insulation layer 50 may alternatively include alternating layers of the organic insulation material and the inorganic insulation material. The third insulation layer 50 is patterned to form an interlayer insulation layer 51.

Figure 9:
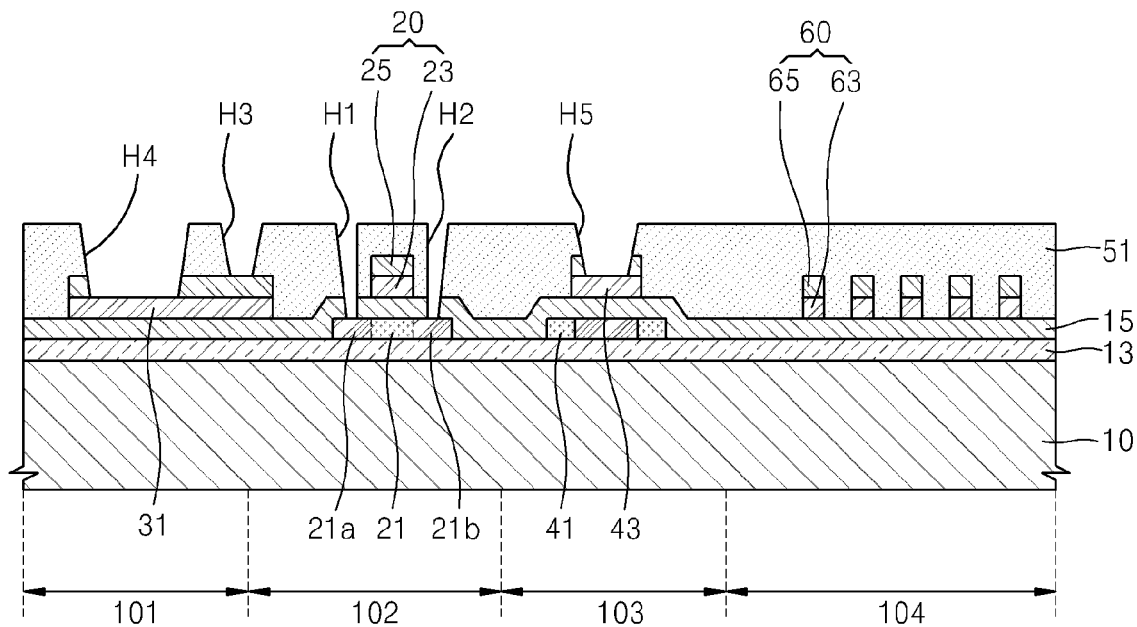

As illustrated in FIG. 9, the interlayer insulation layer 51 has openings H1, H2, H3, H4, and H5 that expose parts of the electrode patterns 30 and 40 and the source/drain areas 21a and 21b. The third insulation layer 50 is patterned using a third mask (not illustrated), so as to form the openings H1, H2, H3, H4, and H5 and thus, for the interlayer insulation layer 51.

The openings H1 and H2 partially expose the source/drain areas 21a and 21b, and the openings H3 and H4 partially expose the second conductive layer 19 and the first conductive layer 17. The opening H5 partially exposes the second conductive layer 19 constituting the upper part of the electrode pattern 40.

Figure 10:
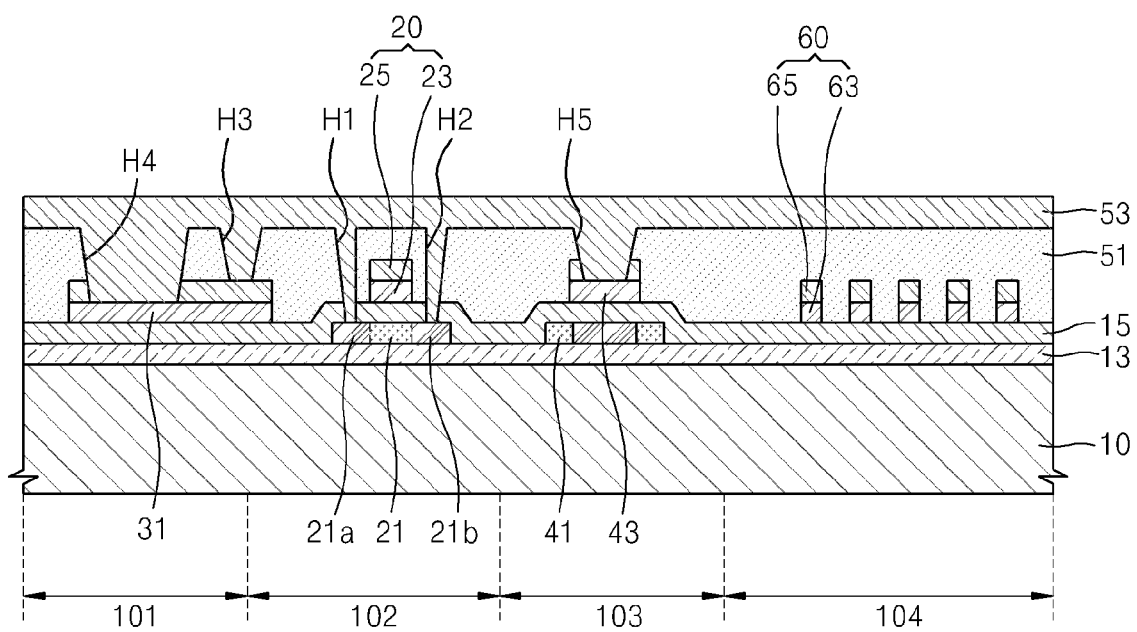

As illustrated in FIG. 10, a third conductive layer 53 is deposited on the substrate 10, so as to cover the interlayer insulation layer 51. The third conductive layer 53 may include the same conductive material as the first and second conductive layers 17 and 19. However, the present invention is not limited thereto, and the third conductive layer 53 may include various other conductive materials. Also, the conductive material is deposited so as to fill the openings H1, H2, H3, H4, and H5.

Figure 11:
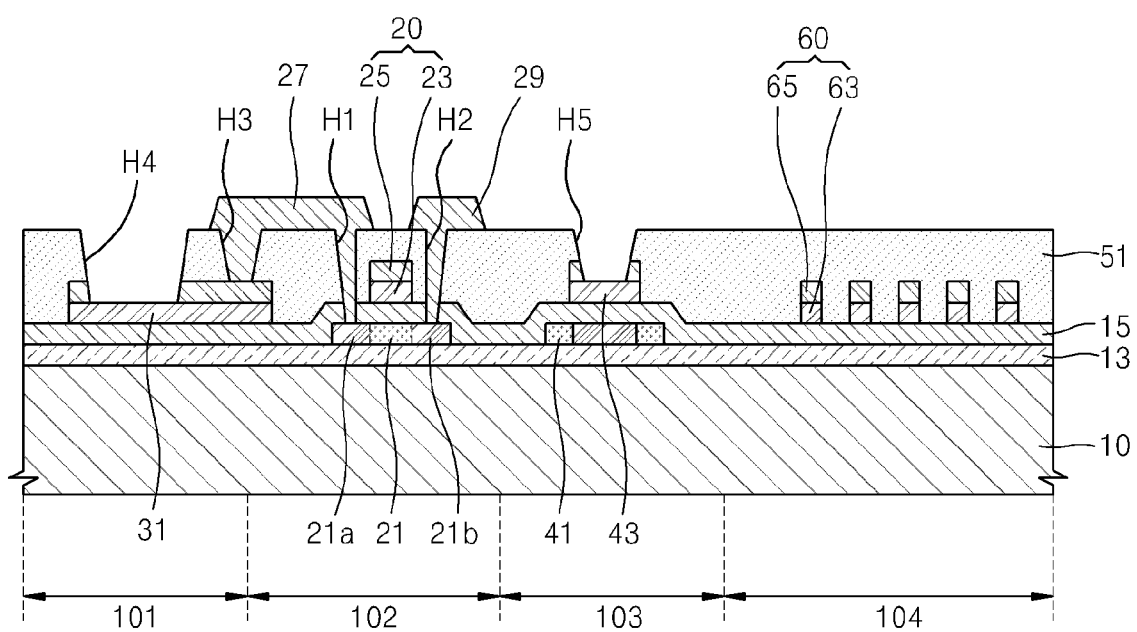

As illustrated in FIG. 11, the source/drain electrodes 27 and 29, the pixel electrode 31, and the upper capacitor electrode 43 are formed. More specifically, the third conductive layer 53 is patterned using a fourth mask (not illustrated) to form the source/drain electrodes 27 and 29. Here, one of the source/drain electrodes 27 and 29 (the source electrode 27 in the present exemplary embodiment) is formed, so as to be connected to the pixel electrode 31 through the opening H3.

After the source/drain electrodes 27 and 29 are formed, the pixel electrode 31 and the upper capacitor electrode 43 are formed by further etching. That is, the portion of the second conductive layer 19 exposed by the opening H4 is removed, so as to form the pixel electrode 31. Then, the portion of the second conductive layer 19 exposed by the opening H5 is removed, so as to form the upper capacitor electrode 43. Accordingly, the pixel electrode 31, the lower gate electrode 23, the upper capacitor electrode 43, and the lower pad electrode 63 are formed from portions of the same layer of material.

Figure 12:
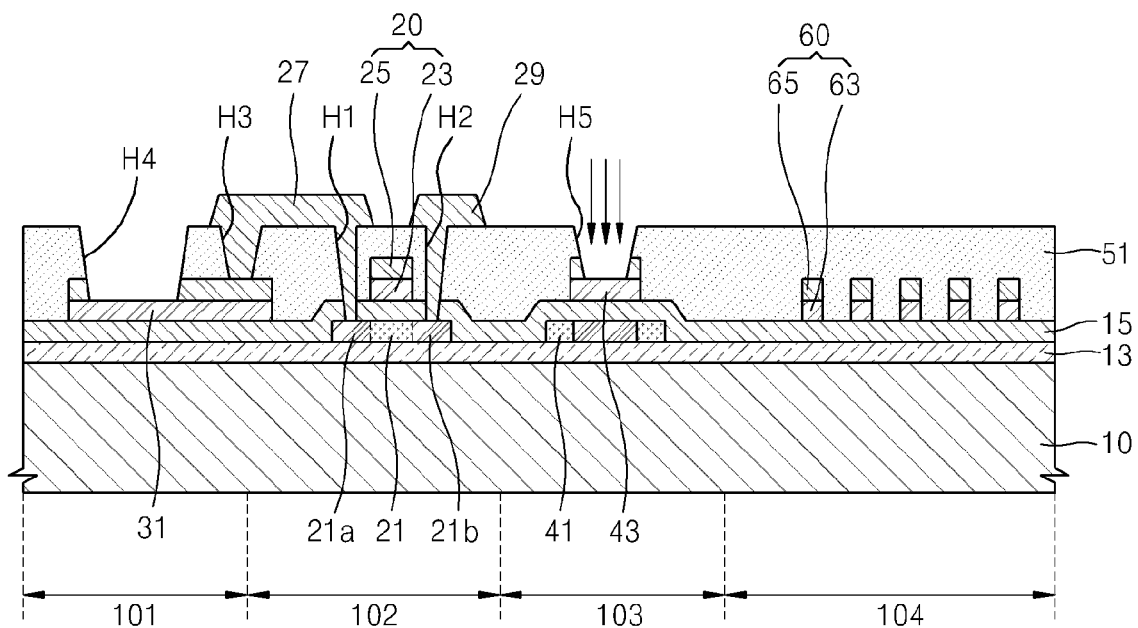

Then, as illustrated in FIG. 12, an n-type or p-type impurity is injected through the opening H5, so as to dope the lower capacitor electrode 41. The impurity may or may not be the same as the impurity used to dope the active layer 21.

Figure 13:
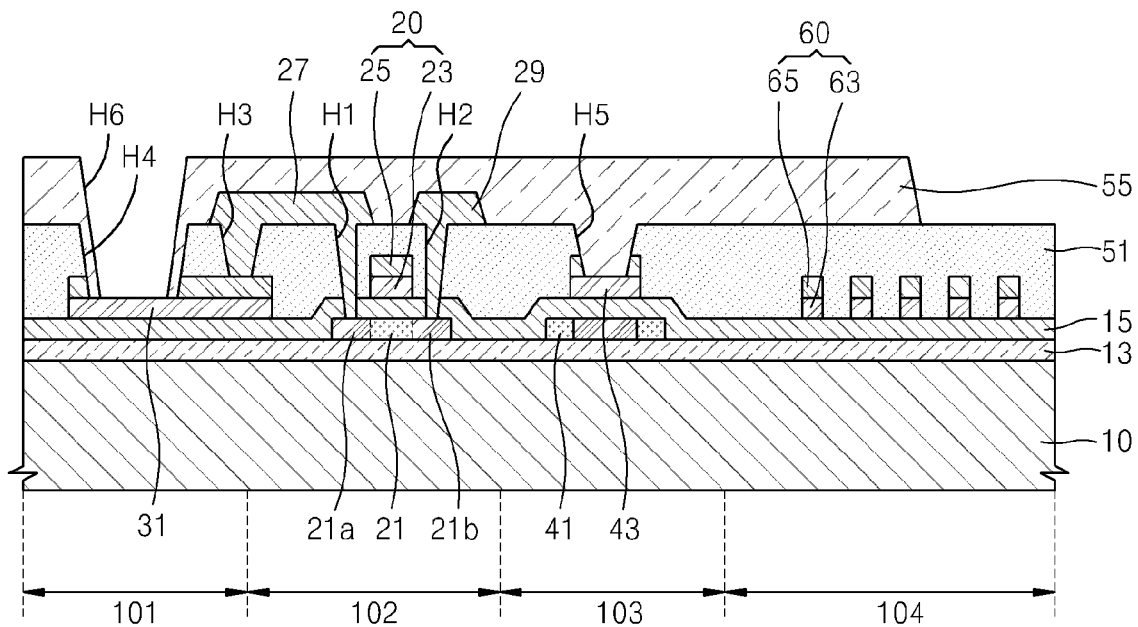

As illustrated in FIG. 13, the PDL 55 is formed on the substrate 10. More specifically, a fourth insulation layer 55 is deposited on the substrate 10, on which the pixel electrode 31, the source/drain electrodes 27 and 29, and the upper capacitor electrode 43 are formed.

The fourth insulation layer 55 may include at least one organic insulation material, such as, a polyimide, a polyamide, an acryl resin, benzocyclobutene, and a phenol resin, and may be formed using spin coating. Also, the fourth insulation layer 55 may include the organic insulation material and an inorganic insulation material, such as $SiO_2$, $SiN_x$, $Al_2O_3$, $CuO_x$, $Tb_4O_7$, $Y_2O_3$, $Nb_2O_5$, and $Pr_2O_3$. In addition, the fourth insulation layer 55 may include alternating layers of the organic material and the inorganic material, as recited above with regard to second insulation layer 15.

The fourth insulation layer 55 is patterned using a fifth mask (not illustrated). As such, an opening H6 is formed to expose a portion of the pixel electrode 31, thereby forming the PDL 55 that defines pixels.

Then, as illustrated in FIG. 2, the intermediate layer 33 and the opposing electrode 35 are formed in the opening H6 and on the pixel electrode 31. The intermediate layer 33 may have a single-layered structure of an emissive layer (EML). The intermediate layer may include additional layers, such as, a hole transport layer (HTL), a hole injection layer (HIL), an electron transport layer (ETL), and an electron injection layer (EIL).

The intermediate layer 33 may include a low-molecular weight organic material or a polymer organic material. When the intermediate layer 33 is formed of the low-molecular weight organic material, the intermediate layer 33 may include the HTL and HIL adjacent to the pixel electrode 31 and may include the ETL and the EIL adjacent to the opposing electrode 35. In addition, various layers may be stacked if needed. The organic material used herein may include copper phthalocyanine (CuPc), N,N'-Di(naphthalene-1-yl)-N,N'-diphenyl-benzidine (NPB), or tris-8-hydroxyquinoline aluminum (Alq3).

When the intermediate layer 33 is formed of the polymer organic material, the intermediate layer 33 may only include the HTL adjacent to the pixel electrode 31. The HTL may be formed on the pixel electrode 31 through inkjet printing or spin coating using poly-(2,4)-ethylene-dihydroxy thiophene (PEDOT) or polyaniline (PANI). The organic material may be a polymer organic material such as poly-phenylenevinylene (PPV) or polyfluorene. A color pattern may be formed using a general method, such as inkjet printing, spin coating, or laser thermal transference.

The opposing electrode 35 may be deposited on the substrate 10 and may be referred to as a common electrode. In the organic light emitting display device 1, the pixel electrode 31 operates as an anode and the opposing electrode 35 operates as a cathode, or vice versa.

When the organic light emitting display device is a bottom emission-type display device, in which an image is projected through the substrate 10, the pixel electrode 31 may be transparent and the opposing electrode 35 may be reflective. A reflective electrode may be formed by depositing a metal having a small work function, for example, Ag, Mg, Al, Pt, Pd, Au, Ni, Nd, Ir, Cr, Li, Ca, LiF/Ca, LiF/Al, or compounds thereof, so as to have a thin thickness.

Although not illustrated, a sealing member (not illustrated) or a moisture absorbent (not illustrated) may be further deposited on the opposing electrode 35, in order to protect the organic light emitting layer from outside moisture and oxygen. In processes using the masks to form the organic light emitting display device, a stacked layer may be removed by dry etching or wet etching.

In the bottom emission type display device, a metal layer is separately formed from the pixel electrode disposed without a reduction in the number of masks, so that light emission efficiency of the pixel electrode increases, an etching property of the gate electrode is secured, the display quality of the display device increases, processes are simplified, and defects are reduced.

In the above exemplary embodiments, the organic light emitting display device is illustrated. However, the present invention is not limited thereto, and various display devices, such as a liquid crystal display device, may be used. In the drawings, only one TFT and one capacitor are illustrated for convenience of description. However, the present invention is not limited thereto, and a plurality of TFTs and capacitors may be included.

According to aspects of the present invention, a manufacturing process may be simplified, an adhesive strength between the pad electrode and the insulation is improved, and thus, defects may be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display device comprising:
   a thin film transistor (TFT) disposed on a substrate and comprising an active layer, a gate electrode, a source electrode, and a drain electrode;
   an organic light emitting device disposed on the substrate, comprising a pixel electrode electrically connected to the TFT, an emission layer disposed on the pixel electrode, and an opposing electrode disposed on the emission layer; and
   a pad electrode disposed on the substrate and comprising openings formed therein, the openings being throughholes formed in the pad electrode,
   wherein the pixel electrode, the gate electrode, and the pad electrode comprise the same type of material and are formed on a same layer of the display device.

2. The organic light emitting display device of claim 1, wherein the openings are circular or ovoid and are uniformly spaced apart.

3. The organic light emitting display device of claim 1, wherein the openings are rectangular and are uniformly spaced apart.

4. The organic light emitting display device of claim 1, wherein:
   the gate electrode comprises a lower gate electrode and a upper gate electrode disposed on the lower gate electrode;
   the pad electrode comprises a lower pad electrode and an upper pad electrode disposed on the lower pad electrode;

the lower gate electrode and the lower pad electrode are formed of the same material and on the same layer of the display device; and the upper gate electrode and the upper pad electrode are formed of the same material and on the same layer of the display device.

5. The organic light emitting display device of claim 4, wherein the lower gate electrode, the pixel electrode, and the lower pad electrode each comprise at least one material selected from the group consisting of ITO, IZO, ZnO, and $In_2O_3$.

6. The organic light emitting display device of claim 4, wherein the upper gate electrode and the upper pad electrode each comprise at least one material selected from the group consisting of Ag, Mg, Al, Pt, Pd, Au, Ni, Nd, Ir, Cr, Li, Ca, Mo, Ti, W, MoW, and Al/Cu.

7. The organic light emitting display device of claim 1, wherein the pixel electrode is electrically connected to the source electrode or the drain electrode.

8. An organic light emitting display device comprising:
a first insulation layer disposed on a substrate;
an active layer of a thin film transistor (TFT) disposed on the first insulation layer;
a second insulation layer disposed on the active layer;
a pixel electrode disposed on the second insulation layer;
a lower gate electrode disposed on the second insulation layer and facing the active layer;
a lower pad electrode disposed on the second insulation layer;
an upper gate electrode disposed on the lower gate electrode;
an upper pad electrode disposed on the lower pad electrode;
a third insulation layer covering the pixel electrode, the upper gate electrode, and the upper pad electrode; and
an electrode of the TFT disposed on the third insulation layer and electrically connected to the pixel electrode, wherein,
the upper pad electrode and the lower pad electrode each comprise a plurality of electrodes that are regularly spaced apart from each other and are all electrically connected to the TFT, the lower pad electrode and the lower gate electrode comprise the same type of material,
the upper pad electrode and the upper gate electrode comprise the same type of material.

9. The organic light emitting display device of claim 8, wherein the lower gate electrode, the pixel electrode, and the lower pad electrode each comprise at least one material selected from the group consisting of ITO, IZO, ZnO, and $In_2O_3$.

10. The organic light emitting display device of claim 8, wherein the upper gate electrode and the upper pad electrode each comprise at least one material selected from the group consisting of Ag, Mg, Al, Pt, Pd, Au, Ni, Nd, Ir, Cr, Li, Ca, Mo, Ti, W, MoW, and Al/Cu.

11. The organic light emitting display device of claim 1, wherein the pixel electrode, the gate electrode, and the pad electrode each comprise a portion of a first electrode layer and an overlapping portion of a second electrode layer.

12. The organic light emitting display device of claim 1, wherein the openings extend completely through the pad electrode.

13. An organic light emitting display device comprising:
a thin film transistor (TFT) disposed on a substrate and comprising an active layer, a gate electrode, a source electrode, and a drain electrode;
a gate insulation layer disposed on the substrate and between the gate electrode and the active layer;
an organic light emitting device disposed on the substrate, comprising a pixel electrode electrically connected to the TFT, an emission layer disposed on the pixel electrode, and an opposing electrode disposed on the emission layer;
a pad electrode disposed on the substrate and comprising through-holes formed therein; and
an interlayer insulation layer disposed on the pad electrode, the interlayer insulation layer extending through the through-holes of the pad electrode to contact the gate insulation layer.

\* \* \* \* \*